United States Patent
Zihir et al.

(10) Patent No.: US 10,879,623 B2
(45) Date of Patent: *Dec. 29, 2020

(54) METHOD TO IMPROVE POWER AMPLIFIER OUTPUT RETURN LOSS AND BACK-OFF PERFORMANCE WITH RC FEEDBACK NETWORK

(71) Applicant: Integrated Device Technology, Inc., San Jose, CA (US)

(72) Inventors: Samet Zihir, San Diego, CA (US); Tumay Kanar, San Diego, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/776,766

(22) Filed: Jan. 30, 2020

(65) Prior Publication Data

US 2020/0169004 A1    May 28, 2020

Related U.S. Application Data

(63) Continuation of application No. 16/449,913, filed on Jun. 24, 2019, now Pat. No. 10,608,347, which is a
(Continued)

(51) Int. Cl.
*H01Q 21/22* (2006.01)
*H01Q 21/24* (2006.01)
(Continued)

(52) U.S. Cl.
CPC ............... *H01Q 21/22* (2013.01); *H01Q 1/26* (2013.01); *H01Q 3/28* (2013.01); *H01Q 3/36* (2013.01); *H01Q 3/40* (2013.01); *H01Q 3/46* (2013.01); *H01Q 21/0025* (2013.01); *H01Q 21/065* (2013.01); *H01Q 21/067* (2013.01); *H01Q 21/205* (2013.01); *H01Q 21/24* (2013.01); *H03F 3/195* (2013.01); *H03F 3/245* (2013.01); *H03F 3/4508* (2013.01);
(Continued)

(58) Field of Classification Search
CPC ............................... H03F 3/245; H01Q 21/22
USPC ....................................................... 455/552.1
See application file for complete search history.

(56) References Cited

U.S. PATENT DOCUMENTS

2007/0140177 A1   6/2007  Li ................................. 370/335
2011/0255434 A1  10/2011  Ylitalo ........................ 370/252

*Primary Examiner* — Joel Ajayi
(74) *Attorney, Agent, or Firm* — Christopher P. Maiorana, PC (57) ABSTRACT

An apparatus includes a plurality of transmitter channels and a plurality of feedback networks. Each of the plurality of transmitter channels may be coupled to a respective antenna element in a respective group of antenna elements of a phased array antenna. Each of the transmitter channels generally comprises a power amplifier circuit configured to drive the respective antenna element in the respective group of antenna elements to produce and steer a radio-frequency beam. Each of the plurality of feedback networks may be coupled between an output and an input of a respective power amplifier circuit of a respective transmitter channel. Each of the feedback networks generally comprises a resistor and a capacitor connected in series. The respective power amplifier circuit with the feedback network generally maintains a power matching condition with load variation associated with performing beam steering of the radio-frequency beam using the antenna elements of the phased array antenna.

20 Claims, 10 Drawing Sheets

Related U.S. Application Data continuation of application No. 16/128,797, filed on Sep. 12, 2018, now Pat. No. 10,381,746.

(60) Provisional application No. 62/559,875, filed on Sep. 18, 2017, provisional application No. 62/560,173, filed on Sep. 18, 2017, provisional application No. 62/575,346, filed on Oct. 20, 2017.

(51) Int. Cl.
*H01Q 3/28* (2006.01)
*H03F 3/45* (2006.01)
*H04B 7/06* (2006.01)
*H01Q 21/06* (2006.01)
*H01Q 3/40* (2006.01)
*H03F 3/195* (2006.01)
*H03F 3/24* (2006.01)
*H04B 1/401* (2015.01)
*H01Q 3/36* (2006.01)
*H04B 1/44* (2006.01)
*H01Q 1/26* (2006.01)
*H01Q 3/46* (2006.01)
*H01Q 21/00* (2006.01)
*H01Q 21/20* (2006.01)

(52) U.S. Cl.
CPC ......... *H03F 3/45085* (2013.01); *H04B 1/401* (2013.01); *H04B 1/44* (2013.01); *H04B 7/0617* (2013.01); *H04B 7/0682* (2013.01); *H04B 7/0691* (2013.01); *H03F 2200/09* (2013.01); *H03F 2200/129* (2013.01); *H03F 2200/144* (2013.01); *H03F 2200/27* (2013.01); *H03F 2200/387* (2013.01); *H03F 2200/451* (2013.01); *H03F 2203/45116* (2013.01); *H03F 2203/45151* (2013.01); *H03F 2203/45302* (2013.01); *H03F 2203/45394* (2013.01); *H03F 2203/45512* (2013.01); *H03F 2203/45526* (2013.01); *H03F 2203/45528* (2013.01)

METHOD TO IMPROVE POWER AMPLIFIER OUTPUT RETURN LOSS AND BACK-OFF PERFORMANCE WITH RC FEEDBACK NETWORK

This application relates to U.S. Ser. No. 16/449,913, filed Jun. 24, 2019, which relates to U.S. Ser. No. 16/128,797, filed Sep. 12, 2018, now U.S. Pat. No. 10,381,746, which relates to U.S. Provisional Application No. 62/559,875, filed Sep. 18, 2017, U.S. Provisional Application No. 62/560,173, filed Sep. 18, 2017, and U.S. Provisional Application No. 62/575,346, filed Oct. 20, 2017, which are hereby incorporated by reference in their entirety.

FIELD OF THE INVENTION

The invention relates to amplifiers generally and, more particularly, to a method and/or apparatus for implementing a method to improve power amplifier (PA) output return loss and back-off performance with RC feedback network.

BACKGROUND

Phased array antenna panels are used to generate steerable beams that may be utilized in wireless communication systems. Phased arrays create a focused beam that can be steered very quickly to maintain a link for any on-the-move communication system. Conventional wireless communications systems can also utilize steerable beams to communicate with multiple wireless nodes by moving the beams from one wireless node to the next. A single beam may service multiple wireless nodes in a sequence and repeat the sequence periodically such that each wireless node appears to be in constant communications with the system. The beam steering is generally implemented by power amplifiers in the transceiver circuitry. The power amplifiers drive respective antenna elements of the phased antenna array to produce and steer the beams.

Generally, power amplifiers (PAs) are designed for maximum power transfer, and small signal output return loss is less of a concern. In general, power transfer is more important than small signal output return loss and the conventional PAs are connected to well-controlled loads like 50 Ohms. To achieve higher power transfer and efficiency, the PA should be in a non-linear mode (one way is Class-AB design). Having higher efficiency PAs means the output return loss will vary with power. The load of the PA is well known and does not change, therefore there is no concern about load change. For this reason, conventional PAs can be designed with poor output return loss (S22). In general, approximately −5/−7 dB return loss is acceptable while a very good matching requires less than −15 dB.

Phased array systems are more susceptible to output return loss because the output of each transceiver is connected to a respective antenna element on a phased array panel. Having 10+ or 100+ antennas on the same phased array panel leads to significant coupling between antennas. The coupling between the antennas results in different impedances for the respective PAs, especially when beam steering of the phased array is performed. Thus, for PAs in a phased array system it would be desirable to have a good output matching (return loss) as well as high output power. In addition, in fifth generation (5G) communication systems, where the PAs are operated in a back-off region (i.e., 3-8 dB back-off from output compression point), the PAs should have good output matching in different output power levels. As a result, a well matched output port is needed at the same time as highest power transfer.

It would be desirable to implement a method to improve PA output return loss and back-off performance with an RC feedback network.

SUMMARY

The invention concerns an apparatus includes a plurality of transmitter channels and a plurality of feedback networks. Each of the plurality of transmitter channels may be coupled to a respective antenna element in a respective group of antenna elements of a phased array antenna. Each of the transmitter channels generally comprises a power amplifier circuit configured to drive the respective antenna element in the respective group of antenna elements to produce and steer a radio-frequency beam. Each of the plurality of feedback networks may be coupled between an output and an input of a respective power amplifier circuit of a respective transmitter channel. Each of the feedback networks generally comprises a resistor and a capacitor connected in series. The respective power amplifier circuit with the feedback network generally maintains a power matching condition with load variation associated with performing beam steering of the radio-frequency beam using the antenna elements of the phased array antenna.

BRIEF DESCRIPTION OF THE FIGURES

Embodiments of the invention will be apparent from the following detailed description and the appended claims and drawings in which:

DETAILED DESCRIPTION OF THE EMBODIMENTS

Embodiments of the present invention include providing a method to improve power amplifier (PA) output return loss and back-off performance with a RC feedback network that may (i) be applied to any amplifier, (ii) be implemented in multi-stage amplifiers, (iii) be implemented using a variety of semiconductor technologies, (iv) improve small signal output return loss in beam former power amplifiers driving phased array antenna panels, (v) improve back-off performance in beam former power amplifiers driving phased array antenna panels, and/or (vi) be implemented as one or more integrated circuits.

Figure 1:
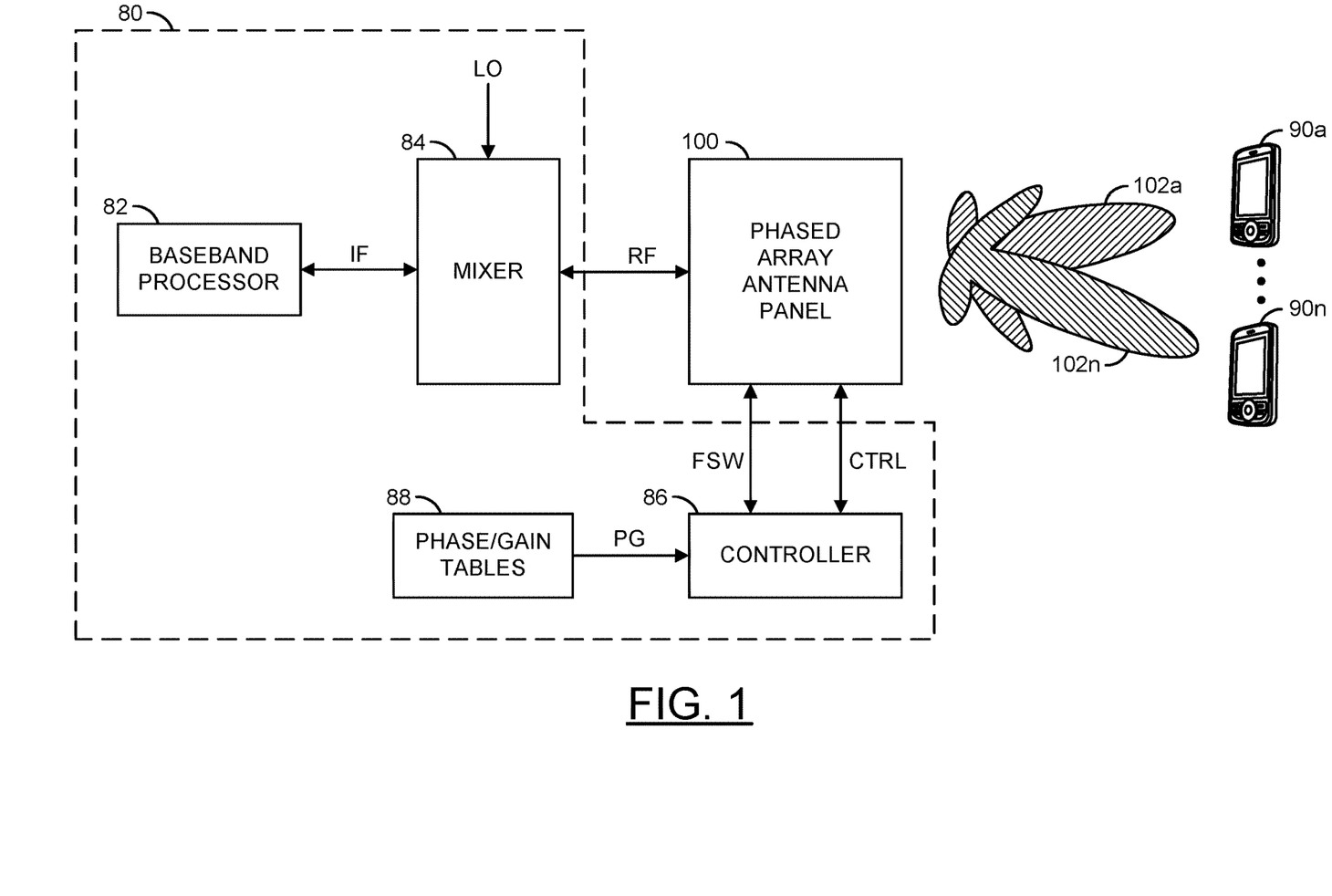
FIG. 1 is a diagram of a system illustrating an example context of the invention.

Referring to FIG. 1, a block diagram of a system 80 is shown illustrating an example context of the invention. The system (or module or circuit or apparatus) 80 may implement a radio-frequency (RF) transceiver system in accordance with an example embodiment of the invention. The RF transceiver system 80 may be configured to operate at common wireless radio frequencies, millimeter-wave frequencies, and/or microwave frequencies. In an example, the RF transceiver system 80 may be configured to facilitate communication with and/or between a plurality of communications devices (or terminals) 90a-90n. In an example, the communications devices 90a-90n may include, but are not limited to, cellular telephones, mobile devices, tablets, internet-of-things (IoT) equipment, etc. In various embodiments, the RF transceiver system 80 and the communications devices 90a-90n may be coupled using at least one phased array antenna panel 100 in accordance with an example embodiment of the invention.

In an example, the RF transceiver system 80 may form part of a communications link. In some embodiments, the communications link may be part of a fifth generation (5G) wireless communications system (e.g., for which a standard is currently under development by the Next Generation Mobile Networks (NGMN) Alliance). In other embodiments, the communications link may be part of systems including, but not limited to, a fourth generation (4G) wireless communications system (e.g., International Mobile Telecommunications-Advanced (IMT-A) standard published by the International Telecommunications Unit Radio-communication Sector (ITU-R)), a satellite communication (SATCOM) system, and point-to-point communications systems such as common data link (CDL). However, other communications standards may be implemented to meet the design criteria of a particular application.

In an example, the RF transceiver system 80 may comprise a block (or circuit) 82, a block (or circuit) 84, a block (or circuit) 86, and a block (or circuit) 88. In various embodiments, the blocks 82-88 may be implemented with hardware, a combination of hardware and software, and/or simulated with software. A signal (e.g., IF) may be exchanged between the circuit 82 and the circuit 84. The signal IF may implement an intermediate-frequency signal. In an example, the signal IF may be configured (e.g., using various modulation schemes) to carry information to be transmitted from and/or received by the RF transceiver system 80. In an example, a signal (e.g., LO) may be presented to the circuit 84. The signal LO may implement a local oscillator signal. A signal (e.g., RF) may be exchanged between the circuit 84 and the phased array antenna panel 100. The signal RF may be a radio-frequency, millimeter-wave frequency, or microwave frequency signal that conveys the information also found in the intermediate-frequency signal IF.

In a transmit mode, the radio-frequency signal RF may convey information to be broadcast from the phased array antenna panel 100 to the devices 90a-90n. In a receive mode, the radio-frequency signal RF may convey information received from the devices 90a-90n via the phased array antenna panel 100. A signal (e.g., FSW) and a signal or signals (e.g., CTRL) may be exchanged between the circuit 86 and the phased array antenna panel 100. The signal FSW may switch the phased array antenna panel 100 between the transmit mode and the receive mode. The signal(s) CTRL may convey data, clocking, and control elements. In an example, the signals FSW and CTRL may be part of a digital interface of the phased array antenna panel 100. In an example, the signal(s) CTRL may be implemented as a serial link that conveys information for configuring and/or determining phase and/or gain settings for antenna elements of the phased array antenna panel 100. In an example, the signal(s) CTRL may be compliant with one or more serial communication protocols or interfaces (e.g., serial peripheral interface (SPI), inter-integrated circuit communications ($I^2C$), daisy chain, etc.). A signal or signals (e.g., PG) may be transferred from the circuit 88 to the circuit 86. In an example, the signal(s) PG may convey phase information and gain information used by the circuit 86 to implement (control) beam steering using the phased array antenna panel 100. In an example, the signal(s) PG may convey a plurality of phase and gain valves that may be programmed into a plurality of beam former circuits of the phased array antenna panel 100 via the signal(s) CTRL.

The phased array antenna panel 100 generally implements a hard-wired address scheme. The hard-wired address scheme may be used to uniquely identify serial communications intended for elements (e.g., the beam former circuits) of the phased array antenna panel 100. In various embodiments, multiple phased array antenna panels 100 may be combined to form a larger antenna array that may provide more transmission channels. The multiple phased array antenna panels may share a serial communication channel, link, or bus. Each of the phased array antenna panels 100 making up the larger antenna array may be uniquely addressed using respective hard-wired addresses.

The phased array antenna panel 100 may generate one or more fields (or beams) 102a-102n. The fields 102a-102n may represent a field pattern (or radio-frequency beam pattern) created by the beam former circuits of the phased array antenna panel 100 based upon the phase and gain information (values) received via the signal(s) CTRL. The phased array antenna panel 100 may be configured to produce directional beams 102a-102n for communication with the communication devices 90a-90n. In an example, the phased array antenna panel 100 may be controlled to steer the beams 102a-102n, based on the phase and gain information received via the signal(s) CTRL, to track movement of the communication devices 90a-90n and/or switch between the communication devices 90a-90n.

The circuit 82 may implement a baseband processor circuit. The circuit 82 may be operational to process the information sent by and/or received in the intermediate-frequency signal IF. The circuit 82 may process the information within the RF transceiver system 80. The processing may include, but is not limited to, modulation/demodulation of the signal that contains the information and management of simultaneous communications between the RF transceiver system 80 and the multiple remote terminals 90a-90n.

The circuit 84 may implement one or more mixer circuits. The circuit 84 is generally operational to frequency convert (e.g., up-convert, down-convert, etc.) between an intermediate frequency used for the signal IF and the radio frequency, millimeter-wave frequency, or microwave frequency used for the signal RF. The frequency conversion may be based on one or more local oscillator frequencies provided by the signal LO. In various embodiments, the radio-frequency signal RF may be in a range of frequencies approximately centered around a center frequency of either 28 gigahertz (GHz) or 39 GHz (e.g., 24 GHz to 30 GHz or 37 GHz to 44 GHz). In embodiments implementing multiple intermediate frequencies, each intermediate frequency may cover a band from approximately 2 GHz to about 6 GHz (e.g., an approximately 4 GHz bandwidth). In an example, each local oscillator frequency may range from approximately 22 GHz to 26 GHz when the signal RF is approximately centered at 28 GHz. In another example, each local oscillator frequency may range from approximately 33 GHz to 37 GHz when the signal RF is approximately centered at 39 GHz. However, other frequency ranges may be implemented to meet the design criteria of a particular application.

The circuit 86 may implement a control circuit. In various embodiments, the circuit 86 may be implemented using one or more of an application specific integrated circuit (ASIC), controller, microprocessor, or circuitry configured accordingly. The circuit 86 is generally operational to control the operations of the phased array antenna panel 100. In some embodiments, the circuit 86 may determine the setting values used in each transceiver channel within the beam former circuits of the phased array antenna panel 100. The setting values may establish the geometry of the field(s) or beam(s) 102a-102n. In various embodiments, the circuit 86 may be implemented as one or more integrated circuits.

In an example, the circuit 88 may implement a table of values (e.g., embodied in a memory circuit). In an example, the table of values embodied in the circuit 88 may be configured to store multiple gain (G) values and multiple phase (P) values. The phase and gain values may be used by the transceiver channels in the phased array antenna panel 100 to establish the fields 102a-102b. The phase values and the gain values may be fetched from the circuit 88 via the signal PG and programmed into buffers associated with the beam former circuits of the phased array antenna panel 100 by the circuit 86. In various embodiments, the circuits 86 and 88 may be implemented either on the same integrated circuit or on different (separate) integrated circuits.

In an example, the phased array antenna panel 100 may be implemented comprising either single-polarization (or single-pole) antenna elements or dual-polarization (or dual-pole or di-pole) antenna elements. The phased array antenna panel 100 may be operational to transmit and receive wireless signals to and from the devices (or terminals) 90a-90n. The devices (or terminals) 90a-90n may be remotely located from the RF transceiver system 80. Sensitivity to the wireless signals may be determined by the fields 102a-102n created by the phased array antenna panel 100. The phased array antenna panel 100 may comprise a plurality of antenna elements and a plurality of beam former circuits. Each beam former circuit may implement a plurality of transceiver channels. Each transceiver channel generally comprises a transmit channel and a receive channel. The transceiver channels may be coupled to the antenna elements by corresponding bidirectional radio-frequency signals. The transceiver channels and antenna elements generally form a two-dimensional antenna network.

Figure 2:
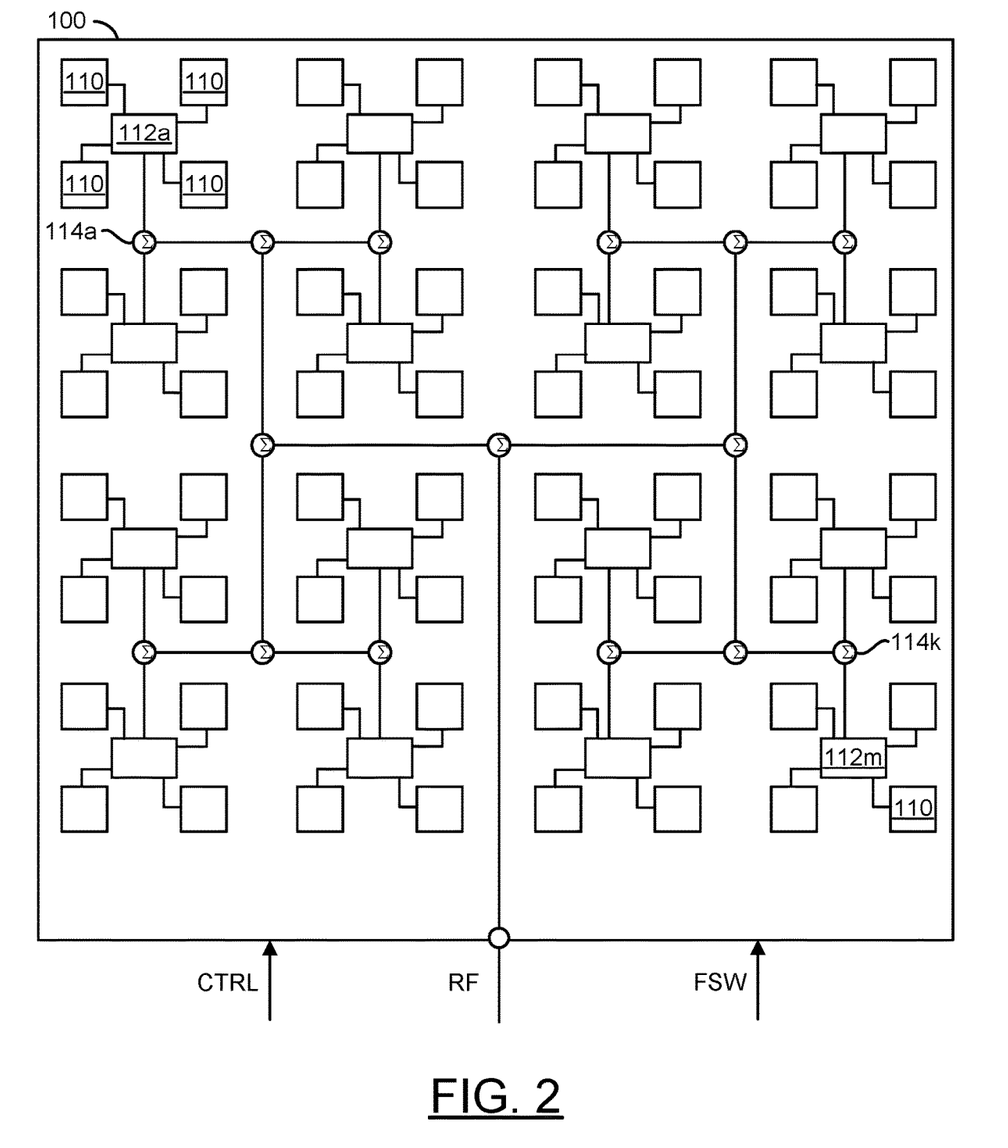
FIG. 2 is a diagram illustrating an example implementation of a single-polarization phased array antenna panel in accordance with an example embodiment of the invention.

Referring to FIG. 2, a diagram is shown illustrating an example implementation of a single-polarization version of the phased array antenna panel 100 in accordance with an embodiment of the invention. In an example, the phased array antenna panel 100 may comprise a number of blocks (or circuits) 110, a number of blocks (or circuits) 112a-112m, and a number of blocks (or circuits) 114a-114k. In embodiments implementing a single-polarization phased array antenna panel, the blocks 110 generally are implemented as single polarization (or single-pole) antenna elements. Each of the circuits 112a-112m may implement a single-polarization beam former circuit. Each of the circuits 114a-114k may implement a combiner/splitter circuit. The circuits 112a-112m, and 114a-114k may be implemented with hardware, a combination of hardware and software, and/or simulated with software. In an example, the signal RF may be exchanged with one of the circuits 114a-114k. The signals FSW and CTRL may be exchanged with the circuits 112a-112m.

The antenna elements 110 in the phased array antenna panel 100 may be used for both transmission and reception. A physical positioning of the antenna elements 110 generally provides for two-dimensional (e.g., horizontal and vertical) control of the fields 102a-102n. In an example, the antenna elements 110 may be arranged in a 2-dimensional (e.g., N×N) grid pattern, where N is an integer value divisible by 2. However, other dimensions of grid patterns may be implemented accordingly to meet design criteria of a particular implementation.

The circuits 112a-112m are generally operational to multiplex/demultiplex the signal RF with a number of the antenna elements 110. In various embodiments, each of the circuits 112a-112m may be mounted on a substrate of the phased array antenna panel 100 adjacent to (e.g., centered among) a number (or group) of the antenna elements 110. In an example, each circuit 112a-112m generally comprises a number of transceiver channels that are coupled to respective antenna elements 110. In an example, each circuit 112a-112m may be coupled to four adjacent antenna elements 110 (e.g., arranged in a 2×2 grid around each circuit 112a-112m). However, other numbers (e.g., 1, 2, 4, 18, etc.) of adjacent antenna elements 110 may be implemented to meet design criteria of a particular implementation. The circuits 112a-112m may be configured to switch between a transmit mode and a receive mode in response to the signal FSW. In the transmit mode, the circuits 112a-112m may be operational to rapidly change setting values (e.g., phase values, gain values, etc.) used by the transceiver channels in order to steer the beams (or fields) 102a-102n formed by the phased array antenna panel 100. In various embodiments, each of the circuits 112a-112m may be implemented as one or more integrated circuits (e.g., in a package or multi-chip module (MCM)).

In various embodiments, each of the circuits 114a-114k may be implemented as a combiner/splitter circuit. In an example, the circuits 114a-114k may be implemented as Wilkinson combiner/splitters. In various embodiments, the circuits 114a-114k may be coupled together to form a network that couples the circuits 112a-112m to an input/output of the phased array antenna panel 100 configured to present/receive the signal RF. In the transmit mode, the circuits 114a-114k are generally operational to distribute the power in the signal RF among the circuits 112a-112m. In the receive mode, the circuits 114a-114k may be operational to combine the power received in signals from the circuits 112a-112m into the signal RF. The circuits 112a-112m and 114a-114k are generally configured to provide a substantially equivalent path length between the RF input/output of the phased array antenna panel 100 and each of the circuits 112a-112m.

In embodiments implementing a dual-polarization version of the phased array antenna panel 100, the antenna elements 110 may be implemented having horizontal and vertical feed ports. The circuits 112a-112m may be configured to be coupled to each respective antenna element 110 by both horizontal and vertical antenna input/outputs. A first set of the circuits 114a-114k may be coupled together to form a first network that couples the circuits 112a-112m to a first input/output of the phased array antenna panel 100 configured to present/receive a horizontal RF signal (e.g., RFH). A second set of the circuits 114a-114k may be coupled together to form a second network that couples the circuits 112a-112m to a second input/output of the phased array antenna panel 100 configured to present/receive a vertical RF signal RFV.

Figure 3:
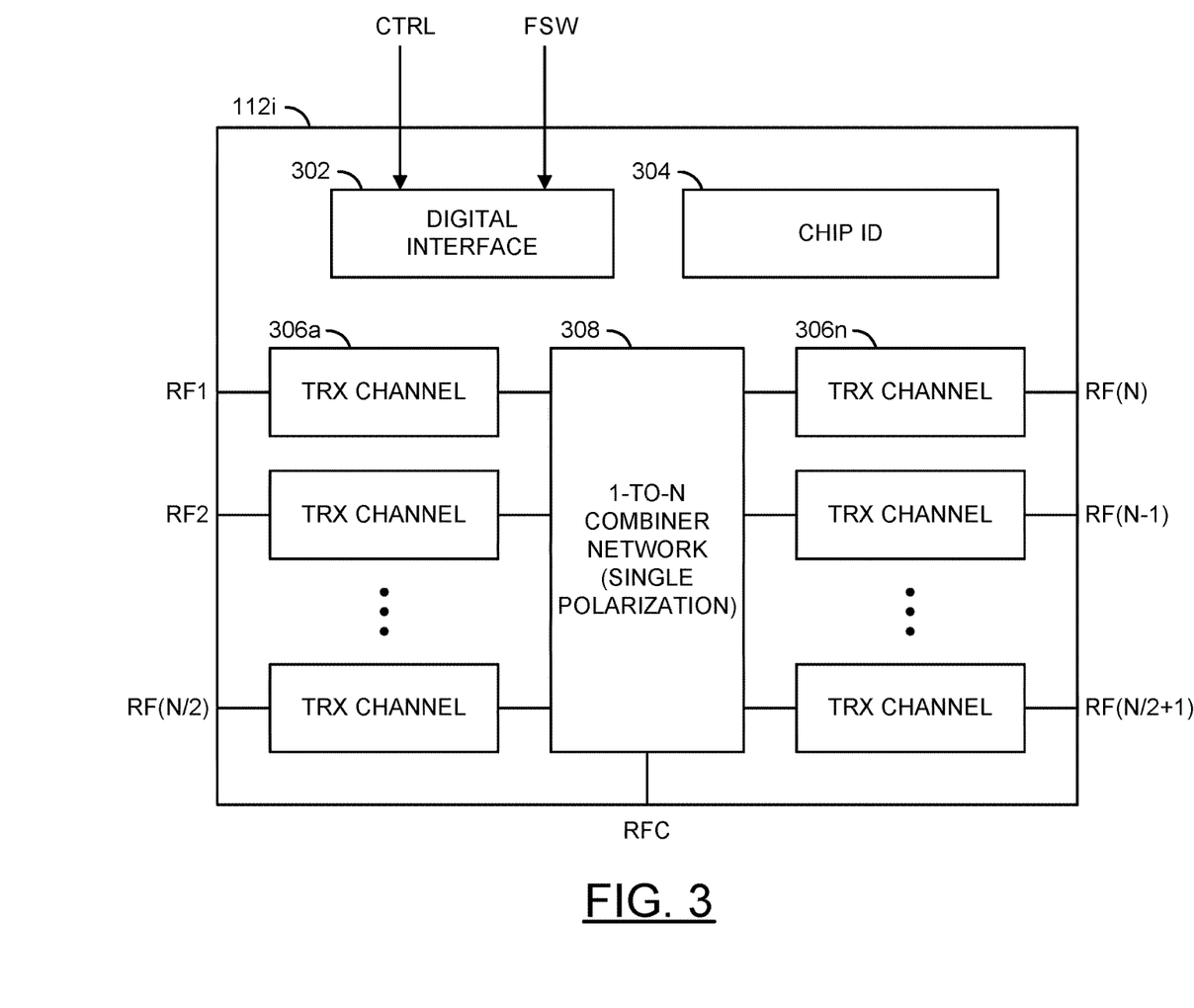
FIG. 3 is a diagram illustrating a single-polarization beam former circuit in accordance with an example embodiment of the invention.

Referring to FIG. 3, a diagram is shown illustrating an example implementation of a single-polarization beam former circuit 112i in accordance with an example embodiment of the invention. In an example, the single-polarization beam former circuit 112i may be representative of the single-polarization beam former circuits 112a-112m of FIG. 2. In an example, the single-polarization beam former circuit 112i may have a digital interface configured to receive the signal FSW and the signal(s) CTRL, a common RF input/output port (RFC), and a number of antenna input/output ports (RF1-RFN). In general, any number (e.g., N) of antenna input/output ports (or channels) may be implemented accordingly to meet design criteria of a particular implementation.

In various embodiments, the signal RF may be presented/received by the common RF input/output RFC, and the antenna input/output ports RF1-RFN may be coupled to respective antenna elements 110. The single-polarization beam former circuit 112i generally implements a number of transceiver channels corresponding to the number of antenna input/output ports RF1-RFN. In various embodiments, each of the transceiver channels may comprise a respective transmit channel and a respective receive channel. The transceiver channels are generally configured to switch between transmitting or receiving based upon the signal FSW.

The single-polarization beam former circuit 112i generally implements a transmit mode and a receive mode. In an example, a state of the signal FSW may determine whether the transmit mode or the receive mode is active. In the transmit mode, the single-polarization beam former circuit 112i is generally configured to receive the radio frequency signal RF at the common input/output port RFC and present radio frequency signals at the antenna input/output ports RF1-RFN. The signals presented at each of the antenna input/output ports RF1-RFN are generated by the single-polarization beam former circuit 112i in response to the radio frequency signal RF received at the common input/output port RFC and a respective number of setting values (e.g., gain, phase, etc.) for each transceiver channel corresponding to each of the antenna input/output ports RF1-RFN. In the receive mode, the single-polarization beam former circuit 112i is generally configured to combine radio frequency signals received at the antenna input/output ports RF1-RFN for presentation as the signal RF at the common input/output port RFC.

The single-polarization beam former circuit 112i may comprise a block (or circuit) 302, a block (or circuit) 304, a number of blocks (or circuits) 306a-306n, and a block (or circuit) 308. The circuit 302 may implement an interface circuit. In various embodiments, the circuit 302 may implement a digital interface. The circuit 304 may implement a hard-wired address (e.g., chip ID) for the beam former circuit 112i. The circuits 306a-306n may implement transceiver (TRX) channels. The circuit 308 may implement a 1-to-N combiner/splitter network.

In an example, the signals FSW and CTRL are exchanged with the circuit 302. In an example, the circuit 302 may comprise a serial interface. The circuit 302 may be configured to be compliant with one or more serial interface standards including, but not limited to, serial peripheral interface (SPI), inter-integrated circuit (I$^2$C), daisy chain, etc. In an example, the circuit 302 may be configured to allow programming and control of the single-polarization beam former circuit 112i using a serial communication link (or bus). In an example, the circuit 302 may be configured to program and control the circuits 306a-306n in response to the signals CTRL and FSW. In an example, the circuit 302 may control whether the circuits 306a-306n operate in a transmit mode or a receive mode in response to the signal FSW. In an example, the circuit 302 may implement a 4-wire embedded SPI core. In an example, the circuit 304 may set a physical address of the beam former circuit 112i based upon hardware coded address bits (or pins). In some embodiments, the hard-wired address bits may be hard coded within the chip implementing the beam former circuit 112i. In some embodiments, the hard-wired address bits may be programmable within the chip implementing the beam former circuit 112i during manufacturing. In an example, the hard-wired address bits may be programmed using fuses, anti-fuses, or other conventional techniques.

In embodiments implementing a dual-polarization, the beam former circuit 112i may be implemented similarly, except that each transceiver channel may be configured to provide separate horizontal and vertical antenna input/outputs (e.g., RFH1 and RFV1, . . . , RFV(N) and RFV(N)), and the circuit 308 may be configured to couple the circuit 112i to separate horizontal and vertical common input/output ports (e.g., RFHC and RFVC).

Figure 4:
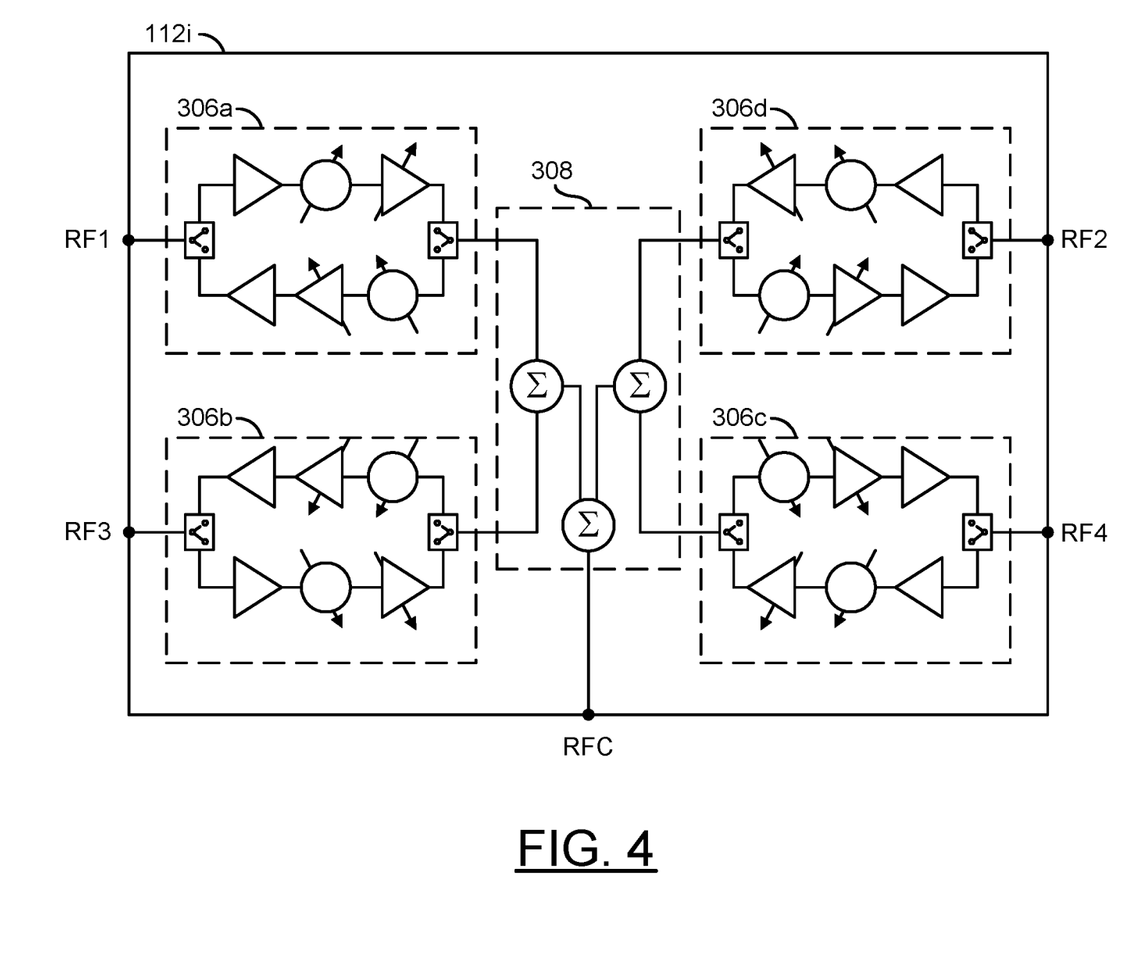
FIG. 4 is a diagram illustrating an example implementation of a generic 2×2 four-element single-polarization transceiver beam former circuit in accordance with an example embodiment of the invention.

Referring to FIG. 4, a diagram is shown illustrating an example implementation of a generic 2×2 four-element single-polarization transceiver beam former circuit 112i in accordance with an example embodiment of the invention. In various embodiments, beam former circuits may implement a plurality of transceiver channels. Each transceiver channel generally comprises a transmit channel and a receive channel. In an example, the 2×2 four-element single-polarization transceiver beam former circuit 112i may implement four transceiver channels 306a-306d. The four transceiver channels (or circuits) 306a-306d may be coupled to respective antenna elements in a group of adjacent antenna elements by corresponding bidirectional radio-frequency signals (e.g., RF1-RF4). The transceiver channels and antenna elements generally form a two-dimensional antenna network.

In an example, the circuit 308 may be implemented as a 1-4 combiner/splitter network. In an example, the circuit 308 may comprise a number of combiner/splitters. In an example, the combiner/splitters may be implemented as Wilkinson combiner/splitters. In various embodiments, the combiner/splitters may be coupled together to form a network that couples the circuits 306a-306d to a common RF input/output port RFC of the beam former circuit 112i. In the transmit mode, the circuit 308 is generally operational to distribute the power in a signal at the common RF input/output port RFC among the circuits 306a-306d. In the receive mode, the circuit 308 may be operational to combine the power received in signals from the circuits 306a-306d into a signal presented at the common RF input/output port RFC. The circuits 306a-306d and 308 are generally configured to provide a substantially equivalent path length between the common RF input/output port RFC and each of the circuits 306a-306d. The topology of the beam former circuit 112i may be scaled to provide other numbers of transceiver channels to meet the design criteria of a particular implementation.

In embodiments implementing dual-polarization phased array antenna panel, a 2>2 four-element dual-polarization transceiver beam former circuit may implement similarly to the transceiver beam former circuit 112i, except with two instances of the four transceiver channels 306a-306d and network 308: a first instance configured for the horizontal transceiver channels; and a second instance configured for the vertical channels.

Figure 5:
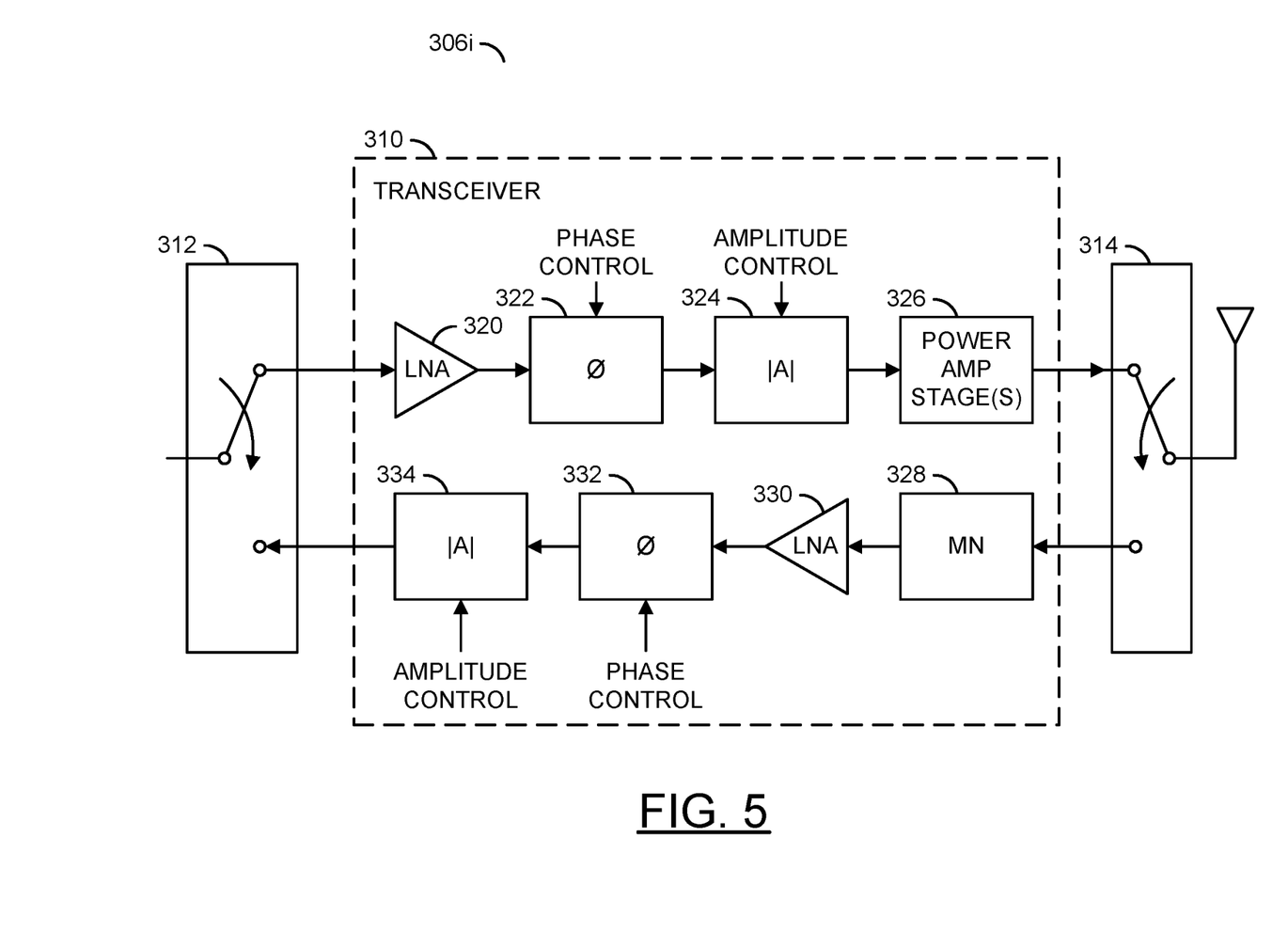
FIG. 5 is a diagram illustrating an example implementation of a transceiver channel with phase and amplitude controls and an output amplifier in accordance with an example embodiment of the invention.

Referring to FIG. 5, a block diagram of a transceiver circuit 306i is shown illustrating a example radio frequency (RF) amplifier application in accordance with an embodiment of the invention. In an example, the transceiver circuit 306i may be representative of the single-polarization beam former transceiver circuits (or channels) 306a-306d of FIG. 4. In another example, the transceiver circuit 306i may be representative of either horizontal or vertical beam former transceiver circuits (or channels) of a dual-polarization beam former circuit (or chip). In an example embodiment, the circuit 306i may comprise a block (or circuit) 310, a block (or circuit) 312, and a block (or circuit) 314. In an example embodiment, the circuit 310 may implement a transceiver circuit. The blocks 312 and 314 may implement transmit-receive (T/R) switches. A transceiver circuit is generally capable of both transmitting and receiving signals of a communication channel. In various embodiments, the circuit 310 may be capable of transmitting and receiving radio frequency (RF), microwave, and/or millimeter-wave signals.

In various embodiments, the circuit 310 may be representative of transceiver circuits utilized in applications including, but not limited to cellular base stations (e.g., 2G, 3G, 4G, 5G, etc.), wireless communication systems, wireless local area networks (WLANs), wireless backhaul channels, broadband repeaters, community antenna television (CATV) networks, macro cells, micro cells, pico cells, femto cells, mobile devices (MDs), and/or portable handheld devices (UEs). In some embodiments, the circuit 310 may be representative of a radar application including, but not limited to target detection, ranging, and/or through-wall imaging. In an example, the transceiver circuit 310 generally comprises both a transmitter chain and a receiver chain. Both the transmitter chain and the receiver chain may comprise radio frequency (RF) amplifiers.

In an example, the transmitter chain may include an input amplifier 320, a variable (programmable) phase shifter 322, a variable (programmable) attenuator 324, and one or more output amplifier stages 326. In an example, the input amplifier 320 may be implemented as a low noise amplifier (LNA). The output amplifier stages 326 may include drivers, pre-amplifiers, and/or power amplifiers. In an example, the receiver chain may include a limiter (or protection) and filter (MN) circuit 328, a low noise amplifier (LNA) 330, a variable (programmable) phase shifter 332, and a variable (programmable) attenuator 334. In an example, an input of the transmitter chain and an output of the receiver chain may be coupled to a transmission line or an RF transceiver system by the RF switch 312. In an example, an output of the transmitter chain and an input of the receiver chain may be coupled to a transmission line or an antenna by the RF switch 314.

In various embodiments, the variable phase shifter 322, the variable attenuator 324, the variable phase shifter 332, and the variable attenuator 334 may be implemented using conventional techniques. In general, the amplifier output return loss and back-off performance improvement technique using an RC feedback network in accordance with an embodiment of the invention may be applied to any of the amplifiers of the transceiver circuit 310 that need to have high power with high efficiency.

Figure 6:
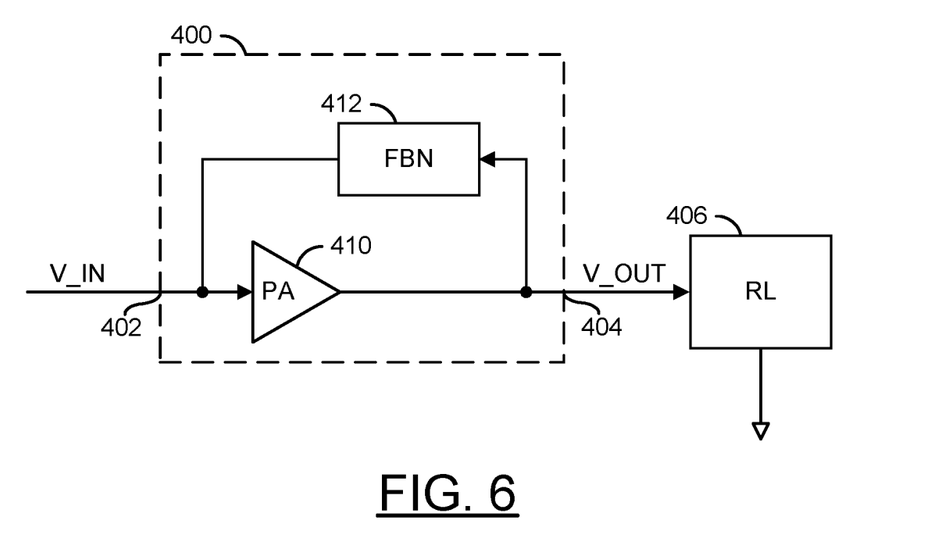
FIG. 6 is a diagram illustrating an example power amplifier circuit in accordance with an example embodiment of the invention.

Referring to FIG. 6, a block diagram of a circuit 400 is shown illustrating an amplifier implementing an RC feedback network in accordance with an example embodiment of the invention. In various embodiments, the circuit 400 may be used to implement various amplifiers in millimeter-wave, microwave, and/or beam former chipsets. In an example, the circuit 400 may be used to implement one or more stages of the power amplifier 326. The circuit 400 may be implemented to simultaneously provide small signal matching as well as maximum power transfer (power matching) for millimeter-wave, microwave, and/or beam former power amplifiers.

In an example, the circuit 400 may have an input 402 that may receive a signal (e.g., V_IN) and an output 404 that may present a signal (e.g., V_OUT). In an example, the output 404 of the amplifier circuit 400 may be coupled to a load 406 (e.g., represented by load resistance RL). In an example where the amplifier 400 is used to implement the circuit 326, the load 406 may correspond to an antenna element of a phased array antenna panel. A relationship between the signal V_OUT appearing across the load resistance RL and the signal V_N presented to the input 402 of the amplifier circuit 400 is generally referred to as a gain (G) of the amplifier circuit 400.

In an example, the amplifier circuit 400 may comprise a power amplifier (PA) 410 and a feedback network 412. However, other types of amplifiers may be implemented accordingly to meet the design criteria of a particular application. In various embodiments, the feedback network 412 may comprise a resistance and capacitance (RC) network. Application of the feedback network 412 generally improves small signal output return loss and back-off performance when used in millimeter-wave, microwave, and/or beam former power amplifiers driving phased array antenna panels.

Figure 7:
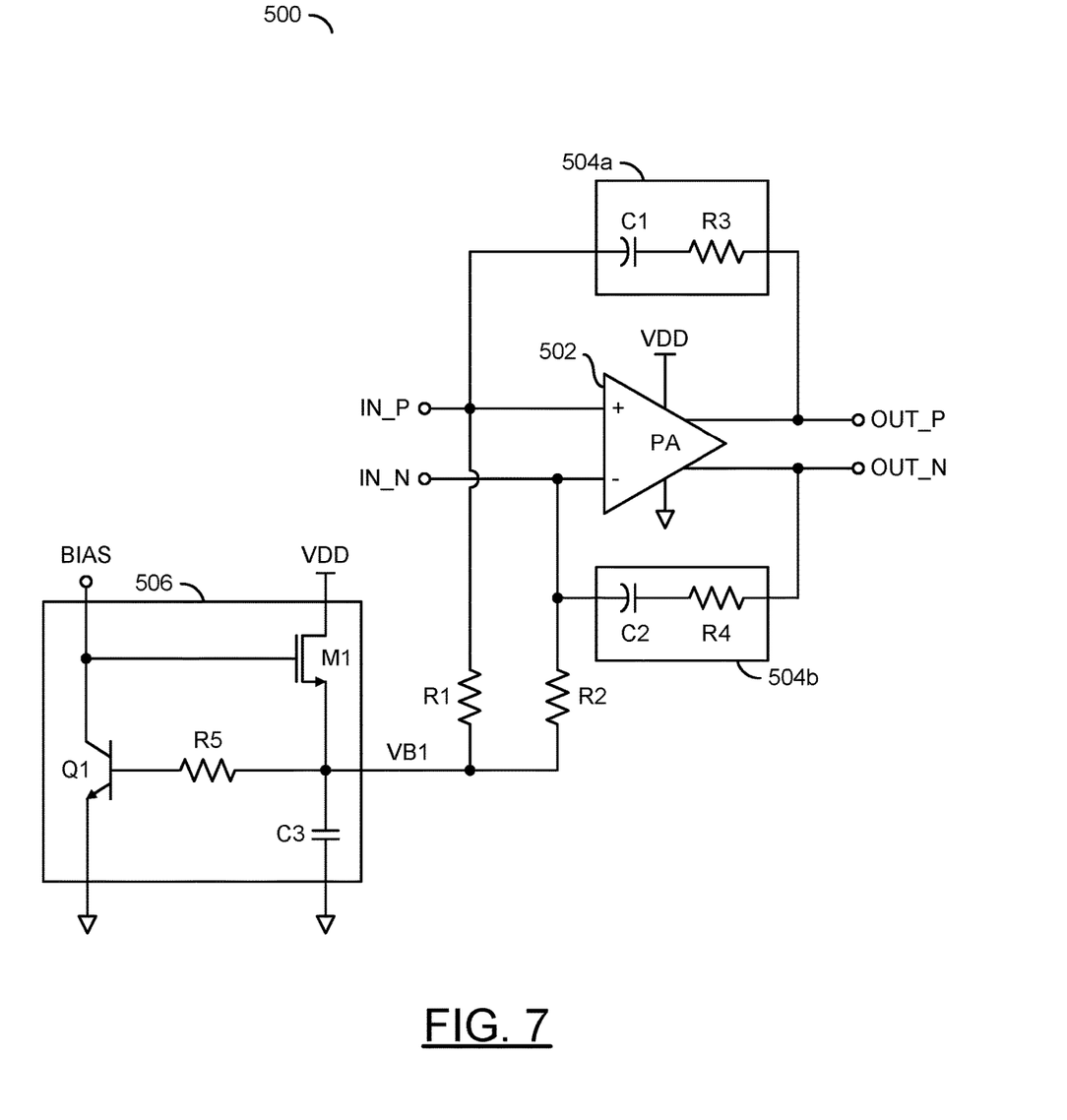
FIG. 7 is a diagram illustrating an example implementation of a power amplifier with RC feedback circuit in accordance with an example embodiment of the invention.

Referring to FIG. 7, a diagram of a circuit 500 is shown illustrating an example implementation of a differential amplifier implementing an RC feedback network in accordance with an example embodiment of the invention. In various embodiments, the circuit 500 may be used to implement various amplifiers in millimeter-wave, microwave, and/or beam former chipsets. In an example, the circuit 500 may comprise a block (or circuit) 502, a block (or circuit) 504a, a block (or circuit) 504b, and a block (or circuit) 506. In an example, the block 502 may implement a differential power amplifier (PA). In an example, the blocks 504a and 504b may implement feedback networks. In an example, the block 506 may implement a bias circuit. In various embodiments, the feedback networks 504a and 504b are implemented using an RC filter. In an example, the PA 502 may implement a single stage PA. The feedback technique illustrated in FIG. 7 may be used with any PA topology including, but not limited to, single-ended, differential, common-emitter, cascade, and stacked amplifiers.

In an example, the amplifier 502 may have a differential input, comprising a positive input (+) and a negative input (−), and a differential output comprising a positive output and a negative output. In an example, a signal IN_P may be presented to the positive input, a signal IN_N may be presented to the negative input, a signal OUT_P may be presented at the positive output, and a signal OUT_N may be presented at the negative output. The signals IN_P and IN_N may be components of a differential input signal. The signals OUT_P and OUT_N may be components of a differential output signal. The amplifier 502 may be configured to generate the signals OUT_P and OUT_N in response to the signals IN_P and IN_N.

In an example, the circuit 504a may be coupled between the positive input and the positive output of the amplifier 502. In an example, the circuit 504b may be coupled between the negative input and the negative output of the amplifier 502. A resistor R1 may have a first terminal connected to the positive input of the amplifier 502 and a second terminal configured to receive a bias voltage (e.g., VB1) or a circuit ground potential. A resistor R2 may have a first terminal connected to the negative input of the amplifier 502 and a second terminal configured to receive the bias voltage (e.g., VB1) or the circuit ground potential. In an example, the circuit 504a may be implemented by a capacitor C1 and a resistor R3 connected in series. In an example, the circuit 504b may be implemented by a capacitor C2 and a resistor R4 connected in series. The values of the capacitors C1 and C2 and the resistors R3 and R4 are generally selected based upon a desired operating frequency. In an example where the operating frequency is 26 GHz, the capacitors C1 and C2 may have values ranging from about 200 to about 250 femtoFarad (fF) and the resistors R1 and R2 may have values ranging from about 100 to about 2000 Ohms.

In an example, the circuit 506 may be configured to generate the bias voltage VB1 in response to a bias signal (e.g., BIAS). In an example, the circuit 506 may comprise a metal oxide semiconductor field effect transistor (MOSFET) M1, a bi-polar junction transistor Q1, a resistor R5, and a capacitor C3. A drain terminal of the transistor M1 may be tied to a power supply voltage (e.g., VDD). The signal BIAS may be presented to a node formed by connection of a gate terminal of the transistor M1 and a collector terminal of the transistor Q1. An emitter terminal of the transistor Q1 may be connected to the circuit ground potential. A base terminal of the transistor Q1 may be coupled by the resistor R5 to a source terminal of the transistor M1. The source terminal of the transistor M1 may be coupled by the capacitor C3 to the circuit ground potential. The bias voltage VB1 may be presented at a node formed by connection of the source terminal of the transistor M1, a terminal of the resistor R5, and a terminal of the capacitor C3. In an example, the transistor Q1 may be implemented as a heterojunction bipolar transistor (HBT). In general, the transistor Q1 may be implemented using transistors similar to transistors used to implement the power amplifier 502.

Figure 8:
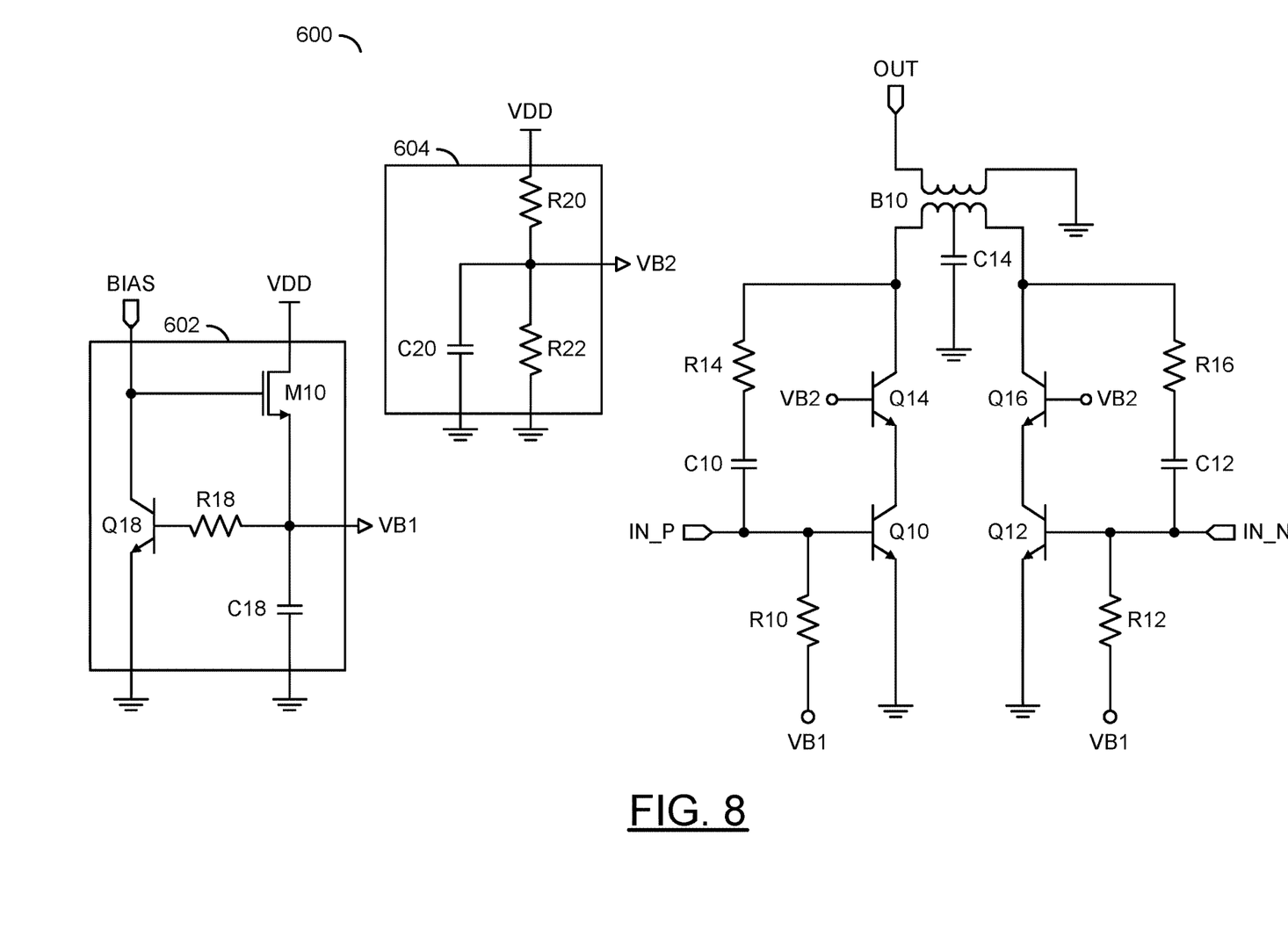
FIG. 8 is a diagram illustrating another example implementation of a power amplifier with RC feedback circuit in accordance with an example embodiment of the invention.

Referring to FIG. 8, a diagram of a circuit 600 is shown illustrating another example implementation of a power amplifier with RC feedback network in accordance with an example embodiment of the invention. In an example, the circuit 600 may be implemented comprising a cascade single stage power amplifier, a first bias circuit 602, and a second bias circuit 604. The bias circuit 602 may be configured to generate a bias voltage (e.g., VB1) in response to a bias signal BIAS and a power supply voltage (e.g., VDD). The bias circuit 604 may be configured to generate a bias voltage (e.g., VB2) in response to the power supply voltage (e.g., VDD).

In an example, the power amplifier comprises a transistor Q10, a transistor Q12, a transistor Q14, a transistor Q16, a resistor R10, a resistor R12, a resistor R14, a resistor R16, a capacitor C10, and a capacitor C12. In an example, the transistors Q10, Q12, Q14, and Q16 may be implemented as heterojunction bipolar transistors. However, other types of transistors (e.g., pHEMT, MOSFET, etc.) may be used accordingly to meet the design criteria of a particular implementation. An emitter terminal of transistor Q10 may be connected to the circuit ground potential. An emitter terminal of transistor Q12 may be connected to the circuit ground potential. The resistor R10 may have a first terminal connected to a base terminal of the transistor Q10 and a second terminal configured to receive the bias voltage VB1. The resistor R12 may have a first terminal connected to a base terminal of the transistor Q12 and a second terminal configured to receive the bias voltage VB1. A collector terminal of the transistor Q10 may be connected to an emitter terminal of the transistor Q14. A collector terminal of the transistor Q12 may be connected to an emitter terminal of the transistor Q16. The bias voltage VB2 may be presented to a base terminal of the transistor Q14 and a base terminal of the transistor Q16. A collector terminal of the transistor Q14 may be coupled to the base terminal of the transistor Q10 by an RC feedback network formed by the resistor R14 and the capacitor C10. A collector terminal of the transistor Q16 may be coupled to the base terminal of the transistor Q12 by an RC feedback network formed by the resistor R16 and the capacitor C12.

An input signal IN_P may be presented to the base terminal of the transistor Q10. An input signal IN_N may be presented to the base terminal of the transistor Q12. The signals IN_P and IN_N may be components of a differential input signal. A first output signal of the amplifier may be presented at a node formed by connection of the collector terminal of the transistor Q14 and a terminal of the resistor R14. A second output signal of the amplifier may be presented at a node formed by connection of the collector terminal of the transistor Q16 and a terminal of the resistor R16. In an example, the outputs of the amplifier circuit may connected to a balun B10 to achieve a single-ended output while the input is differential.

In an example, the circuit 602 may comprise a metal oxide semiconductor field effect transistor (MOSFET) M10, a bipolar junction transistor Q18, a resistor R18, and a capacitor C18. A drain terminal of the transistor M10 may be tied to the power supply voltage VDD. The signal BIAS may be presented to a node formed by connection of a gate terminal of the transistor M10 and a collector terminal of the transistor Q18. An emitter terminal of the transistor Q18 may be connected to the circuit ground potential. A base terminal of the transistor Q18 may be coupled by the resistor R18 to a source terminal of the transistor M10. The source terminal of the transistor M10 may be coupled by the capacitor C18 to the circuit ground potential. The bias voltage VB1 may be presented at a node formed by connection of the source terminal of the transistor M10, a terminal of the resistor R18, and a terminal of the capacitor C18. In an example, the transistor Q18 may be implemented as a heterojunction bipolar transistor. In general, the transistors Q10, Q12, Q14, Q16, and Q18 are implemented using similar types of transistors.

In an example, the circuit 604 may comprise a resistor R20, a resistor R22, and a capacitor C20. In various embodiments, the circuit 604 provides bias for the cascode node of the power amplifier core. A first terminal of the resistor R20 may be tied to the power supply voltage VDD. A second terminal of the resistor R20 may be connected to a first terminal of the resistor R22 and a first terminal of the capacitor C20. A second terminal of the resistor R22 may be connected to the circuit ground potential. A second terminal of the capacitor C20 may be connected to the circuit ground potential. The signal VB2 may be presented at a node formed by the connection of the resistor R20, the resistor R22, and the capacitor C20.

Figure 9:
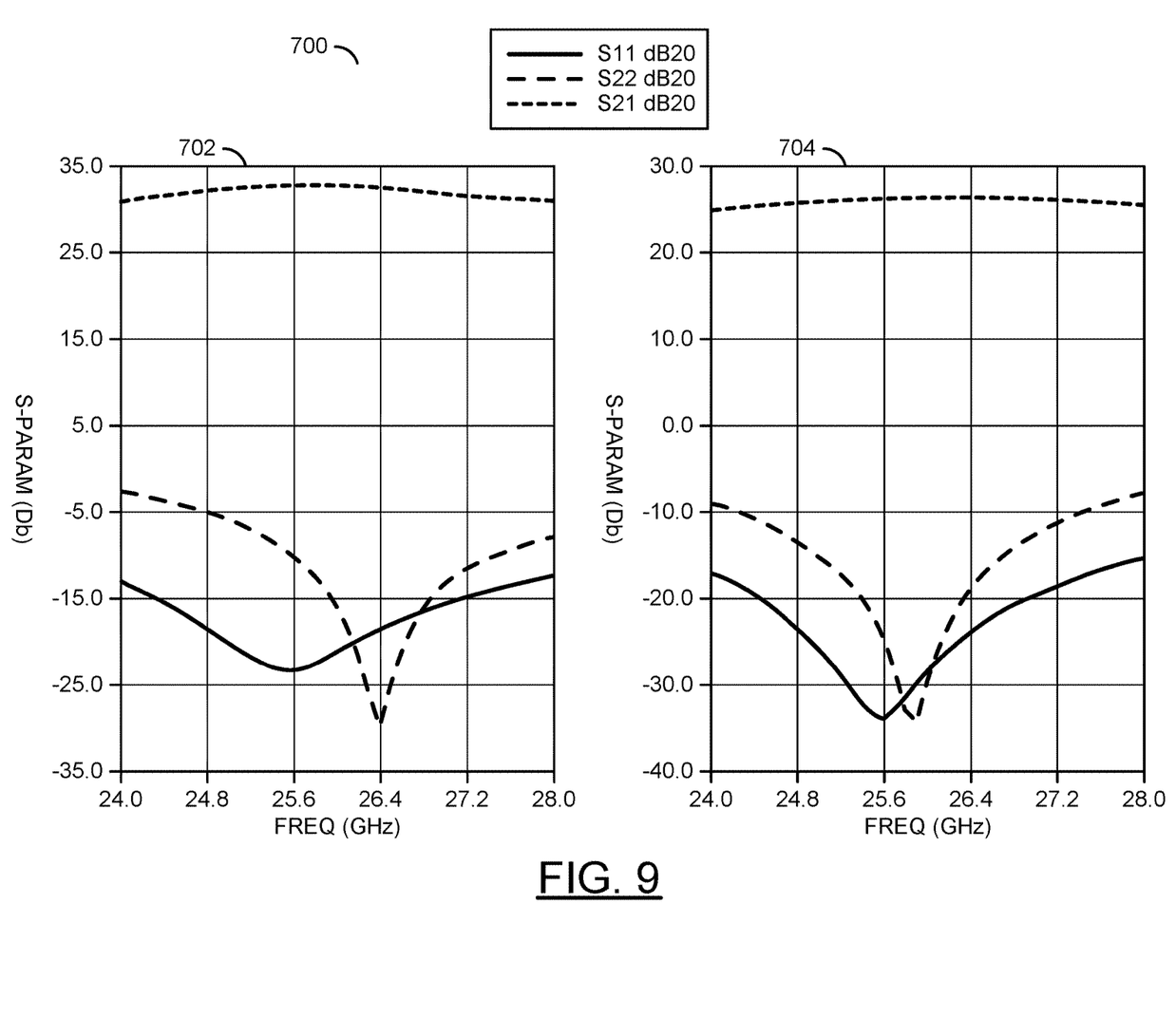
FIG. 9 is a diagram illustrating a comparison between a return loss and back-off performance of a conventional beam former power amplifier and a beam former amplifier with RC feedback circuit in accordance with an example embodiment of the invention.

Referring to FIG. 9, a diagram 700 is shown illustrating a comparison between a return loss and back-off performance of a conventional beam former power amplifier and a beam former amplifier with RC feedback in accordance with an example embodiment of the invention. In an example, a graph 702 illustrates typical S-parameters (e.g., S11, S22, and S21) for a conventional power amplifier design without feedback. A graph 704 illustrates example S-parameters S11, S22, and S21 for a power amplifier design with feedback in accordance with an example embodiment of the invention. As shown by the graphs 702 and 704, S-parameter S22 (output matching) is well matched (better than −20 dB) for the power amplifier designs with and without a feedback network in accordance with an embodiment of the invention.

Figure 10:
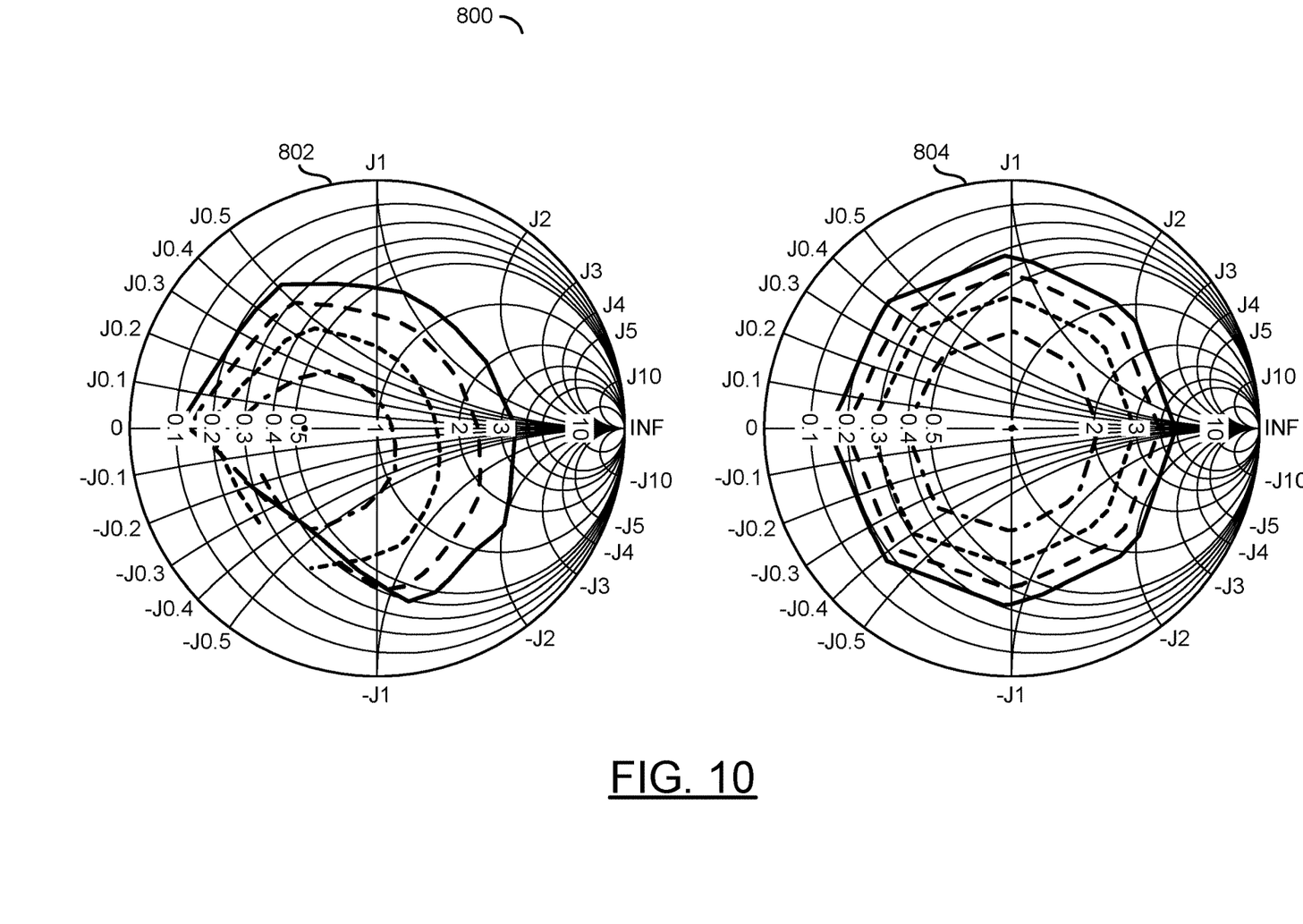
FIG. 10 is a diagram illustrating a comparison between a power output of a conventional beam former power amplifier and a beam former amplifier with RC feedback circuit in accordance with an example embodiment of the invention.

Referring to FIG. 10, a diagram is shown illustrating a comparison 800 between a power output of a conventional beam former power amplifier and a beam former amplifier with RC feedback circuit in accordance with an example embodiment of the invention. In an example, a Smith Chart 802 illustrates typical power circles for a conventional power amplifier design without feedback. A Smith Chart 804 illustrates example power circles for a power amplifier design with feedback in accordance with an embodiment of the invention. The output power circles are shown at 26 GHz with maximum power of 17 dBm. Each circle is 1 dB lower. The load Zo (50 Ohms usually) is the center of the Smith Chart.

In the conventional amplifier (illustrated by the Smith Chart 802), output matching is performed, but the power circles are not centered. In the conventional amplifier, the maximum power transfer occurs when the load is Zo/2 (25 Ohms) rather than Zo. In contrast to the conventional power amplifier, the power circles for an amplifier in accordance with an embodiment of the invention (illustrated by the Chart 804) are centered and, therefore, the maximum output power is achieved when the load is Zo. The centered power circles of the Smith Chart 804 illustrate better power matching for 50 Ohms and better output power vs. load variation. The un-centered power circles in the Smith Chart 702 show the conventional amplifier does not maintain a power matching condition with load variation. The graph 704 (see FIG. 9) and the Smith Chart 804 generally show that both power matching and small signal output matching may be achieved simultaneously (at the same time) using a power amplifier design with an RC feedback network in accordance with an embodiment of the invention.

Although embodiments of the invention have been described in the context of a RF application, the present invention is not limited to RF applications, but may also be applied in other high data rate wireless and wired communications applications where different rapid switching, multiple channel, and multiple user issues may exist. The present invention addresses concerns related to high speed wireless communications, mobile and stationary transceivers and point-to-point links. Future generations of wireless communications applications using radio frequency (RF), microwave, and millimeter-wave links can be expected to provide increasing speed, increasing flexibility, and increasing numbers of interconnections and layers. The present invention may also be applicable to wireless communications systems implemented in compliance with either existing (legacy, 2G, 3G, 4G, 5G) specifications or future specifications.

The terms "may" and "generally" when used herein in conjunction with "is (are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

The invention claimed is:

1. An apparatus comprising:
a plurality of transmitter channels, each coupled to a respective antenna element in a respective group of antenna elements of a phased array antenna, each of said transmitter channels comprising a power amplifier circuit configured to drive said respective antenna element in said respective group of antenna elements to produce and steer a radio-frequency beam, wherein said plurality of transmitter channels are configured to steer said radio-frequency beam in response to phase and gain values that are programmable; and
a plurality of feedback networks, each feedback network coupled between an output and an input of a respective power amplifier circuit of a respective transmitter channel, each of said feedback networks comprising a resistor and a capacitor connected in series, wherein (i) said respective power amplifier circuit with said feedback network operates in a back-off region comprising a range of 3-8 dB back-off from an output compression point and maintains a power matching condition with load variation associated with performing beam steering of said radio-frequency beam using said antenna elements of said phased array antenna, and (ii) each of said feedback networks is configured to improve a back-off performance characteristic of said respective power amplifier circuit.

2. The apparatus according to claim 1, wherein said phase and gain values are programmed via a serial communication interface.

3. The apparatus according to claim 1, wherein the phased array antenna is configured to operate in a frequency range comprising at least one of a radio frequency band, a millimeter wave frequency band, and a microwave frequency band.

4. The apparatus according to claim 1, wherein said plurality of transmitter channels and said plurality of feedback networks are part of a beam former integrated circuit.

5. The apparatus according to claim 1, wherein a resistance value of said resistor and a capacitance value of said capacitor are selected based on an operating frequency of said power amplifier circuit.

6. The apparatus according to claim 1, wherein:
each of said respective power amplifier circuits comprise a differential amplifier circuit; and
each feedback network comprises (a) a first resistor and a first capacitor is connected in series between a first input and a first output of the power amplifier circuit, and (b) a second resistor and a second capacitor connected in series between a second input and a second output of the power amplifier circuit.

7. The apparatus according to claim 6, wherein values of said first and second resistors and values of said first and second capacitors are selected based on an operating frequency of said power amplifier circuit.

8. The apparatus according to claim 6, further comprising a balun configured to convert a differential output of said power amplifier circuit to a single-ended signal.

9. The apparatus according to claim 1, wherein said feedback networks are further configured to improve a small signal output return loss characteristic of said respective power amplifier circuits.

10. The apparatus according to claim 1, wherein said feedback networks provide both power matching and output matching concurrently.

11. A method of improving power amplifier performance in a transmit channel of a phased array antenna, the method comprising:
  coupling each of a plurality of transmitter channels to a respective antenna element in a respective group of antenna elements of said phased array antenna, wherein each transmitter channel comprises a power amplifier circuit configured to drive said respective antenna element in said respective group of antenna elements to produce a steerable radio-frequency beam; and
  coupling a plurality of feedback networks with said plurality of transmitter channels, wherein said plurality of transmitter channels are configured to steer the radio-frequency beam in response to phase and gain values that are programmable, each of said feedback networks is coupled between an output and an input of a respective power amplifier circuit of a respective transmitter channel and is configured to improve a back-off performance characteristic of said respective power amplifier circuit, each of said feedback networks comprises a resistor and a capacitor connected in series, and said respective power amplifier circuit with said feedback network operates in a back-off region comprising a range of 3-8 dB back-off from an output compression point and maintains a power matching condition with load variation associated with performing beam steering of said radio-frequency beam using said antenna elements of said phased array antenna.

12. The method according to claim 11, wherein the phased array antenna is configured to operate in a frequency range comprising at least one of a radio frequency band, a millimeter wave frequency band, and a microwave frequency band.

13. The method according to claim 11, wherein said plurality of transmitter channels and said plurality of feedback networks are instantiated on a beam former integrated circuit.

14. The method according to claim 11, wherein a resistance value of said resistor and a capacitance value of said capacitor are selected based on an operating frequency of said power amplifier circuit.

15. The method according to claim 11, wherein:
  each of said respective power amplifier circuits comprise a differential amplifier circuit; and
  each feedback network comprises a first resistor and a first capacitor connected in series between a first input and a first output of the power amplifier circuit, and a second resistor and a second capacitor connected in series between a second input and a second output of the power amplifier circuit.

16. The method according to claim 15, wherein values of said first and second resistors and values of said first and second capacitors are selected based on an operating frequency of said power amplifier circuit.

17. The method according to claim 15, further comprising:
  using a balun to convert a differential output of each of said respective power amplifier circuits to a single-ended signal.

18. The method according to claim 11, wherein each of said feedback networks is configured to improve a small signal output return loss characteristic of each of said respective power amplifier circuits.

19. The method according to claim 11, wherein said phase and gain values are programmed via a serial communication interface.

20. The method according to claim 11, wherein each of said feedback networks provides both power matching and output matching concurrently.

* * * * *